United States Patent [19]

Salley

[11] 4,066,880

[45] Jan. 3, 1978

[54] SYSTEM FOR PRETESTING ELECTRONIC MEMORY LOCATIONS AND AUTOMATICALLY IDENTIFYING FAULTY MEMORY SECTIONS

[75] Inventor: Ernest J. Salley, Phoenix, Ariz.

[73] Assignee: Engineered Systems, Inc., Phoenix, Ariz.

[21] Appl. No.: 671,938

[22] Filed: Mar. 30, 1976

[51] Int. Cl.² ............... G11C 29/00; G06F 11/00
[52] U.S. Cl. ...................... 235/302.3; 365/200; 235/312
[58] Field of Search ............... 235/153 AC, 153 AM; 340/174 ED, 173 BB; 364/200, 900

[56] References Cited

U.S. PATENT DOCUMENTS

| | | | |
|---|---|---|---|
| 3,644,899 | 2/1972 | Boisvert, Jr. | 340/172.5 |
| 3,772,652 | 11/1973 | Hilberg | 340/172.5 |
| 3,789,205 | 1/1974 | James | 235/153 AC |
| 3,813,032 | 5/1974 | King | 235/153 AC |
| 3,961,252 | 6/1976 | Eichelberger | 235/153 AC |

*Primary Examiner*—Charles E. Atkinson
*Attorney, Agent, or Firm*—Drummond, Nelson & Ptak

[57] ABSTRACT

An MOS RAM read/write memory system has thirty-two 1 × 512 bit RAM memory chips arranged in a matrix. The system pretests all data bit locations for each address prior to the entry of any data into that address, and automatically skips an address having a faulty data bit location in it. In addition, the system functions, upon reading out of data information from the memory chips, to uniquely identify any faulty MOS RAM memory chip; so that it may be removed and replaced if desired.

9 Claims, 5 Drawing Figures

```
011  0000  =  0
011  0001  =  1
011  0010  =  2
011  0011  =  3
011  0100  =  4     } VALID SYSTEM NUMBERS
011  0101  =  5
011  0110  =  6
011  0111  =  7
011  1000  =  8
011  1001  =  9

011  1010  =  :
011  1011  =  ;
011  1100  =  <     } INVALID SYMBOLS
011  1101  =  =
011  1110  =  >
011  1111  =  ?
```

Fig. 5

SYSTEM FOR PRETESTING ELECTRONIC MEMORY LOCATIONS AND AUTOMATICALLY IDENTIFYING FAULTY MEMORY SECTIONS

BACKGROUND OF THE INVENTION

Computer systems and data storage and transfer systems commonly employ random access digital memories (RAM) for storing input data information and permitting the reading out of that information at subsequent random times. In such memories, the address location of the data read into the memory and read from the memory generally is determined by digitally or binary encoded address leads comprising the outputs of a standard binary counter. High density memory systems generally employ MOS RAM memory chips which commonly are produced in standard capacities of 512 or 1024 bits.

In the manufacture of such memory chips, it is not uncommon for one or more bits or address locations in the chip to be faulty and incapable of reliably storing variable binary data. In addition, it is possible for chips which initially are not faulty to become faulty after installation into a system. This may occur either due to mishandling or to inherent weaknesses in the chip which result in a failure of one or more bit locations after prolonged usage.

Systems have been developed in the prior art for "prechecking" memory chips to determine whether or not particular address locations on such chips are bad or faulty. In most such systems, the faulty memory chips are used and the faulty sections are permanently bypassed to spare "replacement" memory chips of the same type into which input data is shunted in parallel with a supply of data to the main memory chip. Since the location of bad memory cells or address locations is done in advance, the shunting of information into the replacement memory is done under the control of permanently set gate circuits. If subsequent to installation into a memory system, a failure should take place in a memory cell in the main memory, such systems do not automatically divert data to be stored into the replacement memory; but such data is directed into the faulty memory. It is readily apparent that this can be highly inconvenient to a user of the system having such a memory in it, if not wholly catastrophic.

It is desirable to provide automatic monitoring and identification of faulty memory chips in a read/write memory system which prevents the entry of data into a faulty memory address location, and which further is capable of pinpointing the location of a faulty memory chip without requiring specific testing for faulty memory locations. Ideally, the identification of a faulty memory chip should be accomplished during normal operation of the system without disturbing that normal operation.

SUMMARY OF THE INVENTION

Accordingly, it is an object of this invention to provide an improved read/write electronic memory system.

It is an additional object of this invention to provide a system for automatically monitoring a read/write memory for faulty chips or faulty address locations.

It is another object of this invention for automatically identifying and pinpointing the location of a faulty bit location in a read/write memory system.

It is a further object of this invention to operate a read/write memory system in a manner which prechecks each address location prior to the entry of data into it, and which automatically skips faulty address locations and prevents the entry of data into such faulty locations.

It is yet another object of this invention to provide a read/write memory system which continuously monitors the memory for faulty bit locations and automtaically identifies such faulty bit locations in the normal operation of the system without disturbing such normal operation.

In accordance with a preferred embodiment of this invention, these and other objects are accomplished in a system comprised of RAM memory chips (each having a capacity of I bits) arranged in K rows and J columns, where K is equal to the number of bits of each binary word stored in the system and J is the number of words in each message. The number of different address locations is equal to I. Each memory chip stores the same bit of each of the words, at the different address locations of the chip; and the memory chips are arranged in a matrix which corresponds directly with the bit sequence of the words in a message. Thus, the physical location of each memory chip uniquely identifies it with a unique bit of each message.

Initially all positions in all of the memory chips are set or cleared to store a binary "1". The address input of the memory is then set to its first position for addressing all of the memory chips in parallel. A scan counter having J outputs then sequentially scans each of the J columns at the selected address location. Each time a column of chips is scanned, all of the chips initially should be storing binary 1's in all positions, but any time a scan samples a binary "0" in any column, an error flag circuit is set. When all of the columns for a given memory address have been scanned, the scanning circuit produces an output which is applied to a coincidence gate along with the output of the error flag circuit. If a binary "0" was detected in any bit location for the selected address, the address is incremented to the next address and the sequence is repeated. Once a sequence has been completed where all of the chips for a given address position provide a binary "1", the system continues to reexamine that memory location until data entry is desired. This is indicated in a data entry circuit which places the system in its write mode of operation under the control of the scan counter to enter the selected data. The entry of data in any memory position causes the storage of at least one binary "0"; so that at the end of the scan sequence, the memory then is stepped to its next address location.

The system further includes a control circuit for reading out all of the messages from the memory circuit in sequence. In the valid data output for the system, no word or character having all binary "1's" exists. Thus, at any time the output from the memory produces a word having K binary "1's" in it as part of a message, that message is indicative of an address having at least one faulty memory chip in it. A printer coupled to respond to the read out data prints each message sequence. Whenever a message sequence is printed including a word or character corresponding to all binary "1's" in the message, it means that the column producing that character is comprised of good memory chips, but that these chips are associated with an address location including at least one faulty chip. Where the faulty chip occurs, at least one binary "0" appears in the data and results in the printing of a character which uniquely identifies the faulty chip, since the memory chip layout directly corresponds with the manner in which the binary data is encoded in the system. This permits the system operator to precisely identify which chip must be replaced out of the total number of chips to place the system back in perfect operating order.

DETAILED DESCRIPTION

Figure 1:
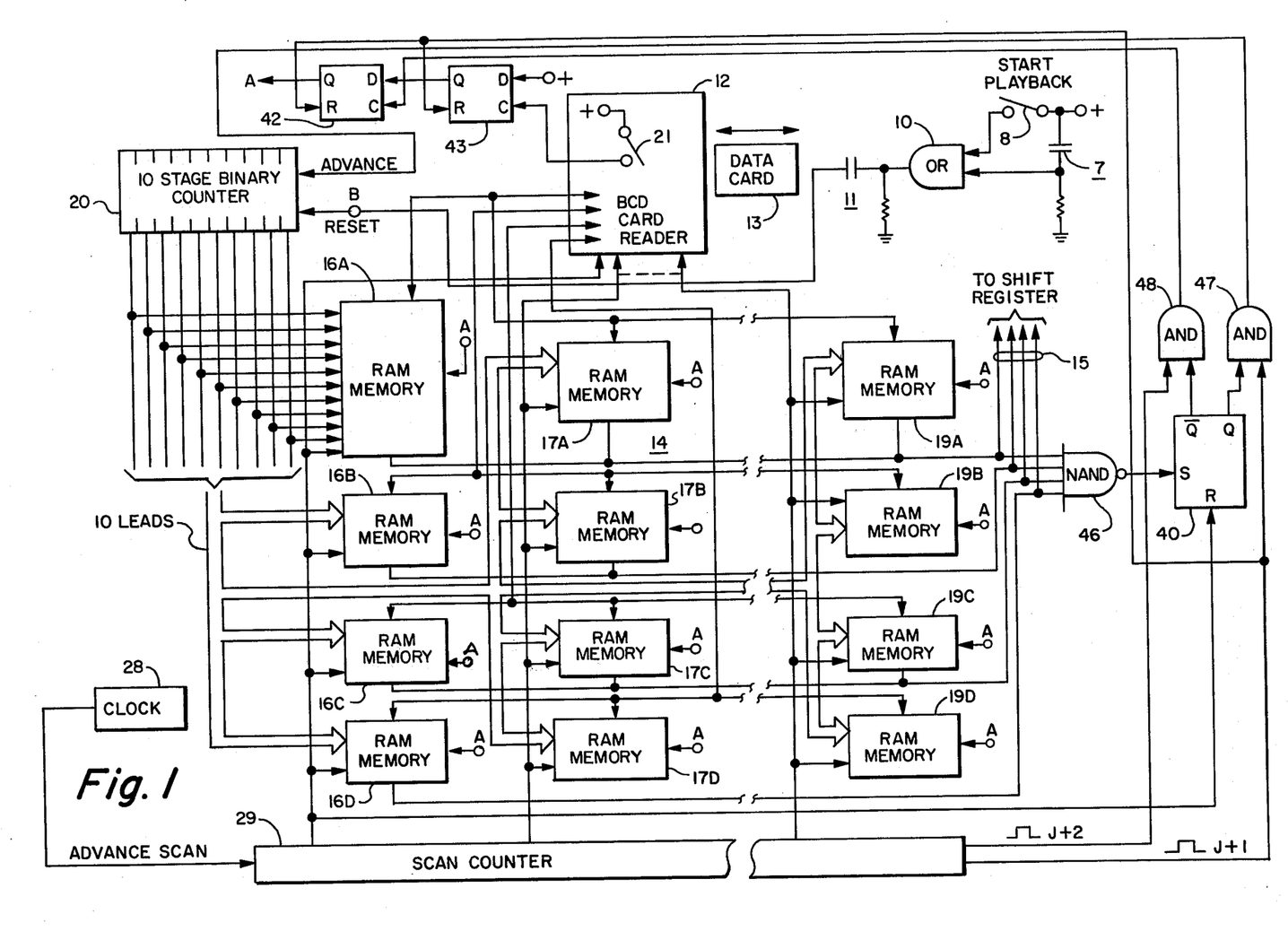
FIG. 1 is a block diagram of a preferred embodiment of the invention for memory precheck, data entry and data readout.

Referring now to FIG. 1 of the drawings, there is shown a preferred embodiment of the invention used in conjunction with a binary coded decimal (BCD) card reader 12. The reader 12 is used to transfer data from data cards 13, which may be inserted into the reader 12 at random intervals, to a multi-stage random access read/write (RAM) bank 14 for storage in the memory and for ultimate transfer or readout from the memory on four BCD coded output terminals 15. As illustrated, the card reader 12 has four parallel output leads 33, 34, 35 and 36 to supply the BCD encoded information read from a data card 13 to the memory bank 14. Typically, the information supplied to the memory bank 14 may be data uniquely encoded to identify the card holder, such as an employee number, job classification, or the like, along with information supplied by the reader 12 itself, such as location and time. Each different BCD digit is encoded in parallel and supplied simultaneously on the leads 33, 34, 35 and 36.

When power is first applied to the system, or whenever a "start playback" switch 8 is operated (closed), a ten-stage binary counter 20, which is operated as an address selection circuit, is reset to its lowest count. The initial application of power to the system causes a "low"-to-"high" pulse transition to be applied through a differentiating circuit 7 to one input of an OR gate 10. The other input to the OR gate 10 is connected to the switch 8. The low-to-high pulse transition, caused either by initial application of power to the system or by closure of the switch 8, is passed by the OR gate 10 through a differentiating circuit 11 to a reset terminal "B" of the counter 20, thereby resetting the counter to its lowest or initial count. The capacitor of the differentiating circuit 11 serves to block the further application of DC potential to the reset terminal "B" of the counter 20. Thus, this reset pulse circuit has no further affect on the counter 20, so long as power is continuously applied to the system and the switch 8 is not reopened and then closed.

The memory bank 14 is arranged into four parallel rows corresponding to the four data output leads 33, 34, 35 and 36 from the card reader 12. Actually, more or fewer rows can be employed, depending upon the system requirements and the type of information which is desired to be transferred from the card reader 12 to the memory bank 14 and ultimately to the output terminals 15. In the system disclosed in FIG. 1, the data to be transferred is all digital data, and the four-lead arrangement encoded in BCD code is a convenient form for handling this data.

The RAM memory bank 14 is arranged in four horizontal rows A, B, C, D or RAM memories 16A, 17A, 19A through 16D, 17D, 19D. The RAM memories 16–19 (each represented by an individual separate MOS RAM integrated circuit chip) are arranged in J vertical columns, where J is equal to the number of different words of information to be supplied from the BCD card reader 12 for the insertion of each data card 13. In a typical system, J is equal to eight, but only three vertical columns 16, 17 and 19 have been shown in FIG. 1, since the connections to the RAM memory chips in each column are the same, and to show more would unnecessarily clutter FIG. 1.

Each of the RAM memory chips 16 through 19 may be a standard MOS RAM memory of 512 bits arranged in a 1 by 1 by 512 configuration. Each memory chip thus has a capability of storing 512 different bits of information. This particular capacity is selected for purposes of illustration, and other memory chips of greater or less capacity could be employed. The bit capacity of the memory thus may be "I" bits, where "I" in the present example is 512. The memory chip arrangement is such that each of the RAM memories 16 through 19 is uniquely identified with a particular bit of a particular word of the encoded message supplied from the card reader 12. Thus, memory 16A is associated with the first bit of the first word in any message, while memory 19D is associated with the fourth or last bit of the last word of each message stored in the memory.

Different messages are stored at different levels or addresses in the memories 16 through 19 up to the 512-bit capacity of each of the memories. The particular level or address is selected according to the state of the outputs of the ten-stage binary counter 20 which are connected in parallel to ten corresponding address leads of all of the memories 16 to 19.

Figure 2:
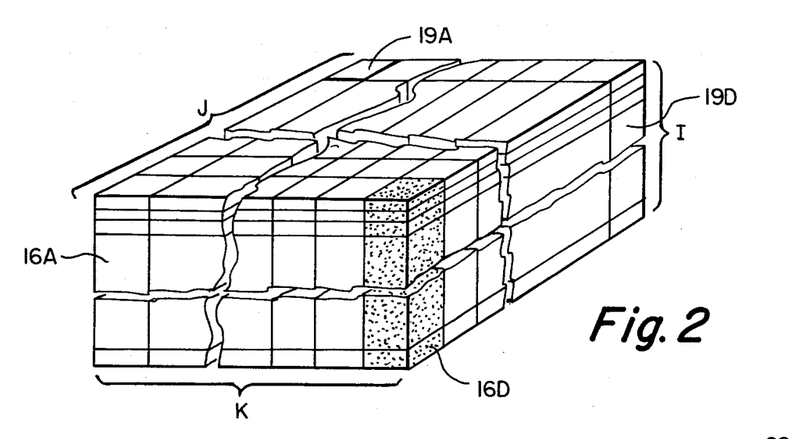
FIG. 2 is a three-dimensional representation useful in explaining the arrangement of the memory chips used in the circuit of FIG. 1.

FIG. 2 shows the memory bank configuration illustrated as a three-dimensional block, having a width of K memory chips, a depth of J memory chips and a height of I bits of memory capacity. In the present example, K is equal to the number of data bits in each word from the BCD card reader 12 (K = four). J may be any suitable number corresponding to the number of words in each message to be supplied from the card reader 12, and in the present example J is equal to eight. As stated previously, I is equal to 512. Each memory chip 16A through 19D then constitutes a vertical column, as illustrated in FIG. 2 by the shading for RAM memory 16D. The address selection from binary counter 20 selects the one horizontal "plane" of the 512 "planes" constituting the memory capacity of the cube, and the input data information is entered in the K × J memory units of the selected memory "plane" from the card reader 12. The physical structure shown in FIG. 2 is not actually used in the system, but is useful in explaining the system configuration.

Assume power has been applied to the system, and it is now ready for operation. In the absence of a data card 13 in the reader 12, a bistable multivibrator 42 supplies a "low" potential on an output terminal A. This terminal is connected to input terminals A of all of the memory units 16 to 19 to place these memory units in their "read" mode of operation. At the time power is applied, all of the bits of all of the memories 16 to 19 are set to the "1" binary state. As stated previously, the ten-stage binary address counter 20 also is reset to its initial or first address.

A free-running clock 28 then supplies advance scan clock pulses to a scan counter 29, which typically may be a ring counter, to sequentially supply enabling signals to the vertical columns of memories 16 through 19. The scan counter 29 has two more stages than the number of columns J of memory chips. The output from the first stage is applied to the reset trigger input of a bistable multivibrator 40 to cause the normal output (Q) of the multivibrator 40 appearing on an output lead 41 to go "low", if that has not been the previous condition of operation of the multivibrator 40. The clock pulses from the clock circuit 28 advance the scan counter 29 through a cycle of operation, commencing with output 1 for enabling the column of RAM memories 16, then the column of memories 17, and so forth, until column 19 is enabled in sequence.

Until a data card 13 is placed into the card reader 12, the output of the bistable multivibrator 42 is indicative of its reset condition and is "low". This low output causes the memories 16 through 19 to be held in their "read" state of operation. This condition remains so long as the bistable multivibrator 42 remains in its reset condition of operation.

When the counter 29 is advanced to its J + 1 stage, a reset pulse is applied to reset inputs of the bistable multivibrator 42 and the reset input of a bistable multivibrator 43 to cause the outputs of both multivibrators to go low. The output of the multivibrator 43 is used to enable the "set" input of the multivibrator 42, so that as long as the output of the bistable multivibrator 43 remains low, the bistable multivibrator 42 cannot be triggered into its high output state by a "set" pulse which may be applied to its "set" trigger input from the scan counter 29 when the counter steps to its J + 2 stage. As a consequence, the operation of the scan counter 29 causes the selected address of the memories 16 to 19 to be continuously and repetitively scanned under the control of the clock pulses from the clock circuit 28.

Figure 3:
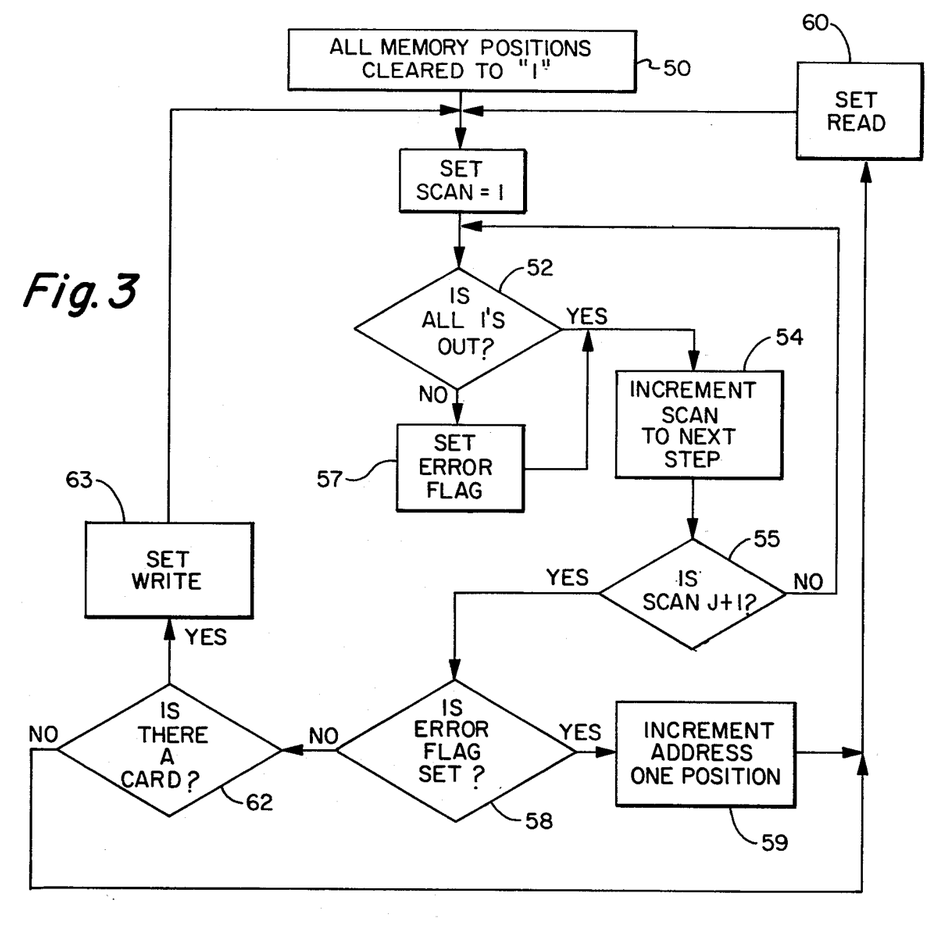
FIG. 3 is a flow chart showing the steps of operation of the system shown in FIG. 1.

Reference now should be made to FIG. 3 which is a flow chart illustrating the manner in which the operating condition of the system which has just been described is used as a precheck of all of the memory positions to determine whether any of the memories 16A through 19D has a bad or faulty storage bit location at the selected address. As stated previously, when the system is first placed in operation, all memory bit storage locations are cleared to binary "1". This is illustrated in FIG. 3 by block 50.

The scan counter 29 then commences the sequential scanning of the different memory columns which causes the information stored in each vertical column to be read out in parallel column-by-column on the leads 15. These output leads also are connected in parallel to corresponding inputs of a four input NAND gate 46 (FIG. 1), the output of which is connected to the "set" input of the bistable multivibrator 40. So long as all of the inputs applied to the NAND gate 46 are "1" or "high", the output of the NAND gate is "low", and the bistable multivibrator 40 remains in its reset condition.

After each advancement of the scan counter 29, a decision is made by the NAND gate 46 as to whether all of the parallel outputs of the memory are "1's". This decision point is indicated in block 52 by FIG. 3. If all of the outputs are binary "1's", the scan counter 29 increments to its next step as indicated in block 54 of FIG. 3. Since all of the memory chips 16 through 19 should be storing binary "1's" in all positions, the inputs to the NAND gate 46 all should be binary "1's" at each step in the scanning sequence. This sequence then continues until the J + 1 scan is reached, as indicated by decisional block 55 in the flow chart of FIG. 3.

When the J + 1 scan step is reached, a pulse is applied to the "reset" inputs of the bistable multivibrators 42 and 43, as described above. At the same time, this positive-going pulse is applied to one of the two inputs of an AND gate 47, the other input of which is the normal output (Q) from the bistable multivibrator 40 appearing on the lead 41. If, during the complete sequence of scanning the selected memory address, all of the bit locations of the selected address stored binary "1's", no output pulse is obtained from the NAND gate 46, and the initial condition of operation of the system remains. Nothing changes. In addition, if no data card has been inserted into the card reader 12, there are no system changes; and the sequence merely repeats itself to continuously recycle and recheck all of the memory chips 16A through 19D for the selected address.

Now assume that if instead of all of the memories storing binary "1's" for the selected address, at least one of the memories 16A through 19D has a faulty bit location at that address. If this is true, the faulty memory will store a binary "0" at the faulty bit location, indicating that it is incapable of being set to or cleared to a binary "1". The cause of the faulty bit or memory chip malfunction is not important. When the column of memory chips including the one with the faulty bit location in it is scanned, the parallel output for that column of memory chips will not be all binary "1's". Thus, at least one of the inputs to the NAND gate 46 is low, causing a high output pulse to be obtained from the NAND gate 46 at the time that column of memories with the faulty chip in it is scanned by the scan counter 29. This "sets" the multivibrator 49 to cause a "high" output to appear on its output lead 41. The multivibrator 40 then comprises the "error flag" indicated by block 57 in FIG. 3. At this time, however, nothing different happens in the sequence of operation which was described previously. The system continues to sequentially scan the remaining columns of memory chips 16 to 19, as indicated by block 54 in FIG. 3.

At the time the J + 1 output of the counter 29 next is enabled, however, the positive J + 1 output pulse is passed by the AND gate 47, which previously was enabled by the "high" output on the lead 41 from the bistable multivibrator 40. This is indicated in FIG. 3 by the decisional block 58. The output pulse from the AND gate 47 then is applied to the counter advance input of the binary counter 20 to cause the counter to advance to the next address, skipping the address with the faulty bit in it. This operation is indicated by block 59 in the flow chart of FIG. 3. The system remains in its "read" state of operation since there is no change in the state of the outputs of the bistable multivibrators 42 and 43 at this time. This is indicated in FIG. 3 by the block 60 in the flow chart. The system then repeats the sequence of operation which has been described above. So long as the new address does not have any faulty bits in it, it is continuously scanned and rechecked until a data card 13 is entered into the card reader 12.

The scan counter 29 continuously operates, as described, under control of the clock pulses from the clock circuit 28. At any time during the scan that a data card 13 is inserted into the card reader 12 for read out by the reader, a switch 21 in the card reader 12 is closed to apply a positive pulse to the "set" trigger input of the bistable multivibrator 43. This causes the output of the bistable multivibrator 43 to go high to enable the "set" trigger input of the multivibrator 42. Until the scan counter 29 completes its scan, the system remains in this state of operation. At the time the next J + 2 output is obtained from the scan counter 29, the system makes the logic decision indicated in block 62 of FIG. 3 to determine whether there is a card available for reading. This decision is accomplished by the pulse on the J + 2 output lead, applied through an AND gate 48 to the "set" input of the bistable multivibrator 42. When the bistable multivibrator 42 is enabled by a high output from the multivibrator 43, the trigger pulse on the output from the gate 48 causes the multivibrator 42 to be "set" to produce a high output to the terminals A of all of the memory chips 16A through 19D. Thus, the memory chips 16 to 19 are placed in their "write" or "receive data" mode of operation. This is indicated in the flow chart of FIG. 3 by block 63.

The next pulse applied from the clock circuit 28 advances the scan ring counter 29 to apply an enabling circuit to its first output lead, enabling the first column of memory chips 16A through 19D. Simultaneously, the first column of information in the card reader 12 is enabled by this same output from the scan counter 29 to transfer the first four-bit BCD encoded word or character of the message from the card reader 12 to the parallel output leads 33, 34, 35 and 36 for storage in the selected address of the corresponding RAM memories 16A through 16D. Since the other output leads from the remaining stages of the counter 29 do not have an enabling output signal on them at this time, the remaining memory chips in columns 17 through 19 of the memory bank 14 are not enabled. This causes the first column or character of the BCD encoded data supplied by the card reader 12 to be stored in the vertical column 16 in horizontal rows A through D, respectively, of the memory.

The RAM memory chips 16 through 19 are of the conventional type which operate to cause input data appearing on the input lines to simultaneously appear on the output lines. As a result, even while the memory is in its "write" mode, the error flag and increment scan sequencing coupled to the NAND gate 46 continues to function.

As stated previously, all of the information supplied from the card reader 12 is numerical BCD encoded information. BCD encoded numerical information is the same as conventional binary numbers and also is the same as the first four digits of the numerical characters of the standard ASCII code commonly employed in data transmission. All of these binary numbers include at least one binary "0". Thus, upon storage of the first word or number of the message from the card reader 12, the NAND gate 46 produces a positive "set" output pulse to the bistable multivibrator 40, causing its output to go high, enabling the AND gate 47 and disabling the AND gate 48. Successive steps of the scan counter 29 then cause successive words of data information from the card reader 12 to be stored in the successive J columns of memory.

When the J + 1 stage of the counter 29 next is enabled, the positive pulse described previously is applied to the AND gate 47 and passes through it to advance the binary counter 22 its next address location. At the same time, the bistable multivibrators 42 and 43 are reset, placing the system in its precheck mode of operation, as described previously. The following J + 2 "set" pulse then is blocked by the gate 48, so that the system must operate in its precheck or "read" mode for at least the next succeeding scan cycle.

If a new data card 13 then is inserted into the reader 12, the sequence described above is repeated. It should be noted that so far as the NAND gate 46 and the bistable multivibrator 40 are concerned, the system operation performed by these circuit elements is the same, irrespective of whether the precheck is indicating a faulty bit storage position in one of the memories 16A through 19D or whether the output of the NAND gate 46 is indicating the storage of valid data in any one of the columns of the memory bank 14. Because of the interrelationship of the card reader 12 and the bistable multivibrators 42 and 43 operating in conjunction with the address counter 20, however, the system automatically operates to advance the counter and skip faulty memory address locations and to properly store data from the data cards 13 inserted in the card reader 12 whenever this is done during a precheck cycle. There is no need for intervention by a system operator to change the mode of operation of the system. This is done automatically.

Whenever it is desired to read data out of the memory bank 14, the "start playback" control switch 8 is momentarily closed. This can be electronically or manually accomplished. As stated previously, this resets the memory 20. The system, however, continues to operate in its "read" mode. At the same time, a reset pulse is applied to the scan counter 29 to reset it to its initial state of operation to enable the first column 16 of the RAM memories in the memory bank 14 for readout. The manner in which this reset pulse is applied to the counter 29 is conventional and is in response to the switching from "write" to "read" in the control circuit 8.

The data present in the memory 14 then is read out on the output leads 15 under control of the scan counter 29 at a rate determined by the output of the clock circuit 28 in the same manner described previously for the precheck reading of the memories. At the end of each complete scan of the entire memory bank 14, the positive reset pulse on the J + 1 output of the scan counter 29 is applied through the AND gate 47 to advance the binary address counter 20 to the next address. This occurs with each complete scan cycle since data is stored in the memories and includes at least one binary "0" in each word to cause the resetting of the bistable multivibrator 40 for each cycle of operation. The system functions in the same manner as illustrated in the flow chart of FIG. 3 for a setting of the error flag (blocks 57 and 58) during each cycle.

The data applied in parallel over the leads 15 are applied in parallel to the first four stages of an eight-stage shift register 70 (FIG. 4) for storage in those stages. The next two stages of the shift register 70 are permanently connected to a source of positive potential to cause binary "1" to be stored in those two stages. The seventh stage is permanently connected to ground potential to cause a binary "0" to be stored in that stage, and the eighth stage is coupled to the output of a conventional parity check circuit 71 which supplies a binary encoded bit to that stage of the shift register 70 to create either an "odd" or "even" parity check pulse as desired. The manner in which this is accomplished is well known and will not be discussed further here.

The "shift" and "load" pulses for operating the shift register 70 are obtained from a clock circuit 280 which is synchronized in operation with the clock 28 of FIG. 1. The frequency of operation of the clock circuit 280 is eight times that of the clock circuit 28; so that the information stored in the shift register 70 can be completely shifted out in series between each storage of new data over an output lead 72 for application to an ASCII transmitter to link the system shown in FIGS. 1 and 4 with a remote computer or teletypewriter terminal, if desired.

The output pulses produced by the clock 280 are also supplied through a divide-by-eight circuit 75 which produces an output pulse once each time the shift register 70 has had all the previous data in it shifted out to the terminal 72. The pulses on the output of the circuit 75 are synchronized with the advance pulses from the clock circuit 28 (FIG. 1) and occur slightly after the occurrence of the clock pulses applied to the input of the scan counter 29. This permits the data read from the memory bank 14 to appear on the output leads 15 prior to the application of each load pulse on a lead 76 from the circuit 75 to the shift register 70. Each time a pulse appears on the lead 76, all of the data applied to the eight stages of the shift register 70 in parallel is loaded into the shift register for subsequent shifting out of the register onto the lead 72 under the operation of the clock 280.

Figure 4:
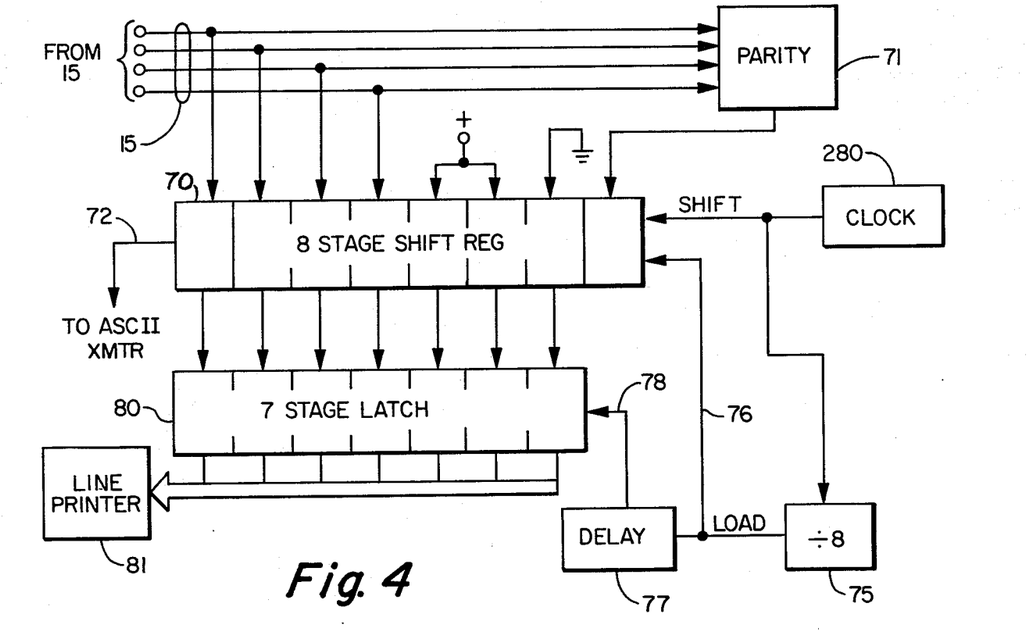
FIG. 4 is a block diagram of a readout and monitoring system used with the system of FIG. 1.

The load pulses on the lead 76 also are applied to a delay circuit 77 which delays the application of a latching pulse on a lead 78 sufficiently to permit the information applied to the inputs of the shift register 70 to be loaded into the register before the pulse on the lead 78 appears. The information stored in the first seven stages of the shift register is temporarily stored in a seven-stage latch circuit 80, which comprises seven conventional bistable latch circuits in response to the pulse on the lead 78.

Figure 5:
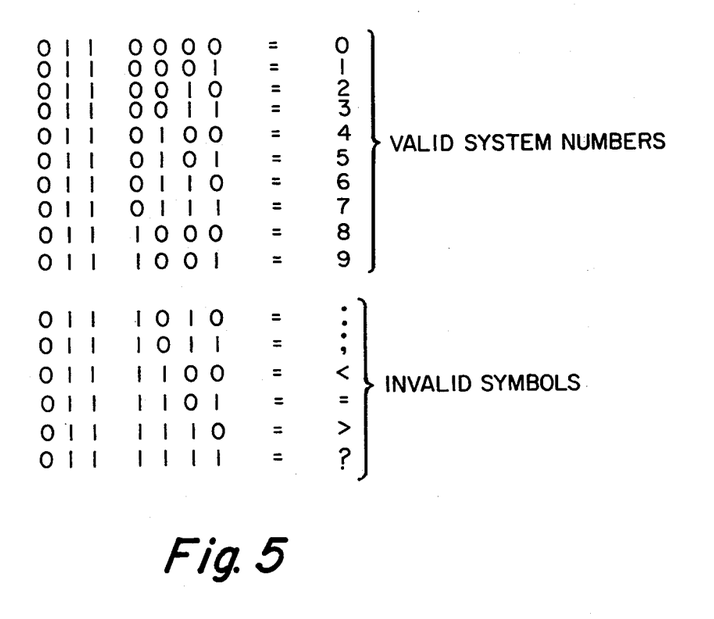
FIG. 5 is a chart useful in explaining the operation of the systems shown in FIGS. 1 and 4.

The outputs of the latch circuit 80 then are applied to a conventional ASCII printer 81 which may be located at the local card reader terminal, or, in the alternative, the printer 81 may be located at a remote terminal and responsive to received data transmitted from the lead 72. In any event, the printer 81 prints each message sequence received from the memory bank 14 under the control of the address counter 20 and scan counter 29. In the example given, each message comprises eight characters or "words" (J = 8), and each of these words is a unique numerical character (0 through 9). FIG. 5 illustrates the valid system numbers and possible invalid symbols which will be printed by the printer 81 in response to all of the different possible code combinations the system is capable of supplying to the printer 81.

Whenever a valid message is received, all of the symbols which are printed will be valid system numbers as indicated in the upper portion of FIG. 5. The significant digits are the four right-hand digits, since these are the variable ones obtained from the RAM memories 16A through 19D. The three left-hand bits of the ASCII code shown in FIG. 5 are those which are permanently added to the information received over the leads 15, as described previously in conjunction with FIG. 4. These three bits do not change, as is apparent in FIG. 5. The BCD coded numbers then can be used directly to produce ASCII numerical characters with the system shown in FIG. 4. In addition, combinations of four binary bits, however, can represent higher digital numbers or characters which are invalid for this system. These invalid combinations result in the ASCII code symbols illustrated in FIG. 5 as "invalid symbols".

From an examination of FIG. 5, it is noted that a BCD coded output of all binary "1's" is decoded in the ASCII code transformation circuit of FIG. 4 as a question mark (?). As described previously, this combination of all binary "1's" for any vertical column of memory chips only occurs in conjunction with a memory address which has been "skipped" in the entry of data, since none of the entered data ever has all binary "1's" in it for valid data obtained from the card reader 12. As a consequence, any time a message includes anywhere in it a printed question mark (?), this means that the column of memories which produced that ASCII symbol or character is comprised of good memory chips, but that these memory chips are associated with an address location which includes at least one faulty memory chip somewhere in it.

Whenever a faulty chip occurs, a binary "0" appears in the BCD encoded signal for the column of memories including the faulty memory chip. Normally, only a single memory chip in any column will ever have an invalid bit at a given address at any one time. This means that in the message including a question mark (?), there also then will be printed either a seven (7), a semicolon (;), an equal sign (=), or >. This can be ascertained by an examination of the characters of FIG. 5, since each of these four characters or "words" include one binary "0".

The sequence of words or characters including the identification of such a faulty memory chip for a bit location and address for the eight-word or eight-character message described in this system probably will include a message with seven question marks (?) and one of these other four characters, (7 —; — = — >) at some location in the message, for example: ????? = ?. This occurs when the memory precheck sequence described previously in conjunction with FIG. 3 detects a faulty bit at an address and causes the system to skip that address and go on to the next one before the entry of any variable data from the card reader 12.

The printout, however, can be used to pinpoint the exact location of the particular memory chip which is malfunctioning, since the chip layout is made in accordance with the matrix of FIGS. 1 and 2. The BCD output leads are arranged so that horizontal row A of the memory bank 14 is connected to the upper lead 15, the row B is connected to the second lead 15, row C is connected to the third lead 15, and row D is connected to the fourth or bottom lead 15. These leads, in turn, as shown in FIG. 4, are connected to the first four stages, respectively, of the shift register 70. Thus, the right-hand bit of each of the system numbers and symbols shown in FIG. 5 is generated by the memory chips 16A, 17A, 19A, in row A. Similarly, the next most significant bit, the second from the right in FIG. 5, is generated by the memory chips of row B, and the fourth bit (the left-most one of the four right-hand bits in FIG. 5) is generated by the memory chips 16D through 19D fo row D.

For each eight-character or eight-word message, the first character is produced by column 16 of the memory, the second by column 17, and so forth, with the last character produced by the memory chips in column 19. Thus, by locating a message with a series of question marks in it and one or more other binary symbols, it is possible to specifically locate the column and row of faulty memory chips.

If more than one faulty bit occurs in any column of memory chips, it is possible that valid system numbers may be printed in conjunction with a sequence of question marks in the columns. These valid system numbers indicate by a binary "0" each location of a faulty memory chip. In actual operation, however, there rarely will be more than one faulty memory chip at any given address location, although it is possible.

Each system number or invalid symbol printed in conjunction with a question mark (?) in a message, however, specifically identifies faulty memory chips. As a consequence, the system continuously monitors the memory storage system used in the data entry store-and-forward system of FIG. 1, either locally or at a remote terminal, and specifically identifies faulty memory chips at specific address locations whenever these occur. Nothing is required on the part of the operators of the system to cause this to happen. It occurs automatically in normal operation of the system without any special test sequences or test procedures being necessary.

As a consequence, whenever a memory chip is found to have one or more faulty storage bit locations in it, notification at the local terminal data entry may be made to inform a repairman precisely which memory chip out of the total number of memory chips in the system he must replace to put the system back in perfect operating order.

If only one or two bits of a chip are faulty, the operator of the system has the option of leaving the faulty chips in the system, since the system automatically skips over the faulty memory locations in its operation and no harm other than a small loss of total capacity results from use of such faulty memory chips.

The system described above operates to substantially reduce potential errors in data storage and transfer. In addition, the system functions to store and transmit errorfree data, even though one or more memory chips may have one or more faulty bit storage locations in them. The monitoring of the system for faulty memory bit locations occurs automatically in the normal operation of the system without the necessity of introducing any special test procedures or test operation sequences into the system. Furthermore, the system specifically identifies the exact location of a faulty memory chip, so that it may be replaced with minimum effort and expense at the convenience of the system operator.

I claim:

1. A system for detecting errors and identifying error locations in read/write memory during use of such memory, including in combination:
   read/write memory means for storing a plurality of binary encoded words at a plurality of address locations, each word having at least two binary bits, said memory means initially being cleared to a condition in which all of the binary bits thereof should be of the same type; identifying means coupled with said memory means and responsive to a readout of the words stored therein for identifying a faulty bit of a word at any address location which is not cleared; and
   addressing means for selecting different address locations in said memory means, and means coupled with said identifying means for causing said addressing means to select a new address location upon identification of a faulty bit by said identifying means.

2. The combination according to claim 1 wherein said memory means is configured to store a predetermined number of words at each address location and further including scanning means coupled with said memory means for selecting word locations within said selected address location, said addressing means and said scanning means causing said word locations in said memory means to be read out in a predetermined sequence.

3. The combination according to claim 2 wherein said identifying means comprises means for displaying indicia uniquely representative of each different combination of binary bits in each of said binary encoded words.

4. The combination according to claim 3 wherein the predetermined number of words at each address location comprises a message, and said display by said identifying means of a word having all of said bits thereof of the same type causes a predetermined word to be displayed in the message of which such word is a part, the display of any such predetermined word in a message being indicative of an error condition in any other word of said message which is not said predetermined word.

5. A system for detecting errors and identifying error locations in read/write memory during use of such memory, including in combination:
   read/write memory means for storing a plurality of binary encoded words at a plurality of address locations, each word having at least two binary bits, said read/write memory means comprised of K times J memory chips, each having a capacity of I bits, wherein K is the number of bits in each binary encoded word, J is the number of words in a message stored at each address location, and I is the number of different address locations, said memory chips being arranged so that corresponding bits of each of the words in each of the address locations are stored in a single memory chip, so that the first bit of the first word in each address location is stored in a first memory chip, with the last bit of the last word in each message being stored in the last (K times J) memory chip, said memory means initially being cleared to a condition in which all of the binary bits thereof should be of the same type; and identifying means coupled with said memory means and responsive to a readout of the words stored therein for identifying a faulty bit of a word at any address location which is not cleared.

6. The combination according to claim 5 wherein said identifying means comprises printing means for printing unique symbols representative of the binary bit sequence of each of the binary encoded words, and wherein a symbol other than the symbol for a predetermined word occurring in any message also including a symbol for said predetermined word is indicative of a faulty memory bit location in the word represented by such other symbol, thereby uniquely identifying a faulty memory chip out of the total K times J memory chips used in the system.

7. The combination according to claim 6 wherein K is equal to 4, said identifying means includes means for adding three predetermined bits to each of said words read out from said memory means to encode said words in the ASCII code, and said printing means comprises a printer responsive to said ASCII code.

8. A system for testing-before-storing binary encoded data in a read/write memory including in combination:

read/write memory means having a plurality of bit locations for storing a plurality of binary encoded words at a plurality of address locations, each of said words comprised of at least two binary data bits, said memory means initially being cleared to cause all of the address locations of said memory means to store the same predetermined type of binary data bit at all bit locations of said memory means;

addressing means for selecting address locations in said memory means;

scanning means coupled with said memory means for scanning all of the word locations at the selected address;

readout means coupled with said memory means for reading out the binary encoded words stored in each address location and providing a first output for each such address location when all of the binary bits thereof are of the same predetermined type and for providing a second output when any one binary data bit of the words stored at any address location is not of said same predetermined type;

means coupled with said readout means for incrementing said addressing means to the next address location of said memory means in response to the second output of said readout means to repeat the cycle and read out the words in the next address location;

data entry means for writing uniquely encoded binary data into address locations of said memory means; and means coupled with said readout means and responsive to the first output thereof for enabling said data entry means to write data into an address location following said readout to determine that binary bits of said predetermined type previously were stored at all bit locations of such address location.

9. The combination according to claim 8, wherein said readout means comprises coincidence gate means, and a bistable multivibrator responsive to the output of said gate means and to a predetermined output of said scanning means for advancing said addressing means in response to the second output from said coincidence gate means.

* * * * *